(12) United States Patent
Asakura

(10) Patent No.: US 7,422,655 B2
(45) Date of Patent: Sep. 9, 2008

(54) APPARATUS FOR PERFORMING SEMICONDUCTOR PROCESSING ON TARGET SUBSTRATE

(75) Inventor: Kentaro Asakura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 10/553,843

(22) PCT Filed: Apr. 20, 2004

(86) PCT No.: PCT/JP2004/005632

§ 371 (c)(1),
(2), (4) Date: Oct. 20, 2005

(87) PCT Pub. No.: WO2004/095568

PCT Pub. Date: Nov. 4, 2004

(65) Prior Publication Data

US 2006/0219178 A1    Oct. 5, 2006

(30) Foreign Application Priority Data

Apr. 21, 2003 (JP) ............................. 2003-116390
Sep. 29, 2003 (JP) ............................. 2003-338585

(51) Int. Cl.
*H01L 21/00* (2006.01)
*C23C 16/00* (2006.01)
*C23C 14/00* (2006.01)

(52) U.S. Cl. ............................. 156/345.51; 156/345.52; 156/345.53; 156/345.54; 156/345.55; 118/728; 118/725; 118/724; 204/298.01; 204/192.1

(58) Field of Classification Search ................. 118/728, 118/500; 156/345.51
See application file for complete search history.

(56) References Cited

U.S. PATENT DOCUMENTS

| 5,430,271 A | * | 7/1995 | Orgami et al. | ............... 219/388 |
| 5,566,744 A | * | 10/1996 | Tepman | ...................... 165/80.1 |
| 5,589,224 A | * | 12/1996 | Tepman et al. | ........... 427/248.1 |
| 6,887,317 B2 | * | 5/2005 | Or et al. | ...................... 118/728 |

FOREIGN PATENT DOCUMENTS

| JP | 10-102259 | | 4/1998 |
| JP | 11-16858 | | 1/1999 |
| JP | 11204430 A | * | 7/1999 |
| JP | 2000306851 A | * | 11/2000 |
| JP | 2001-210597 | | 8/2001 |
| JP | 2003-124297 | | 4/2003 |

* cited by examiner

*Primary Examiner*—Ram N. Kackar
(74) *Attorney, Agent, or Firm*—Oblon, Spivak, McClelland, Maier & Neustadt, P.C.

(57) ABSTRACT

An apparatus for performing a semiconductor process on a target substrate (W) includes a lifting mechanism (48) disposed in a worktable (38) to assist transfer of the target substrate. The lifting mechanism includes a lifter pin (51) configured to support and move up and down the target substrate, and a guide hole (49) configured to guide the lifter pin being moved up and down. The guide hole includes a main hole portion (49a) which extends through the worktable from its upper surface to lower surface, and an extended hole portion (49b) which extends into an extension sleeve (66) which projects downward from the lower surface of the worktable to correspond to the main hole portion.

20 Claims, 7 Drawing Sheets

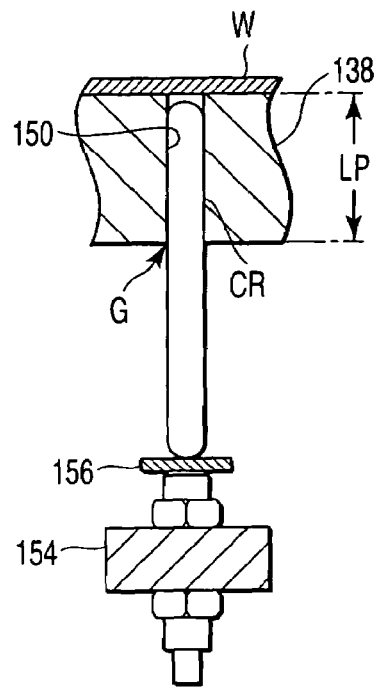
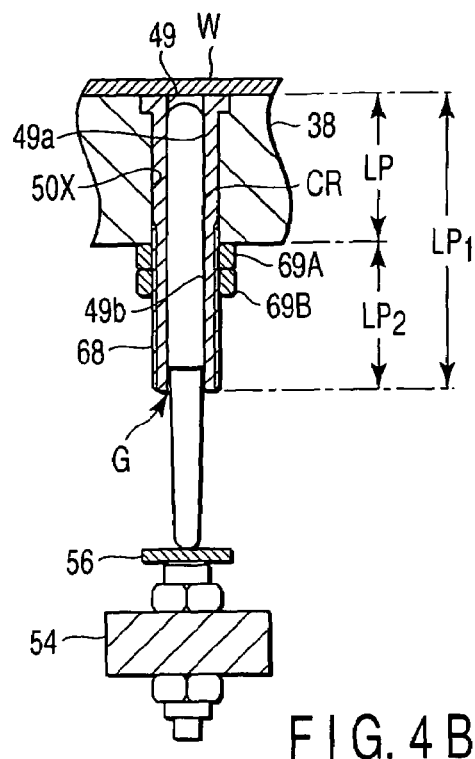
FIG. 4A  FIG. 4B
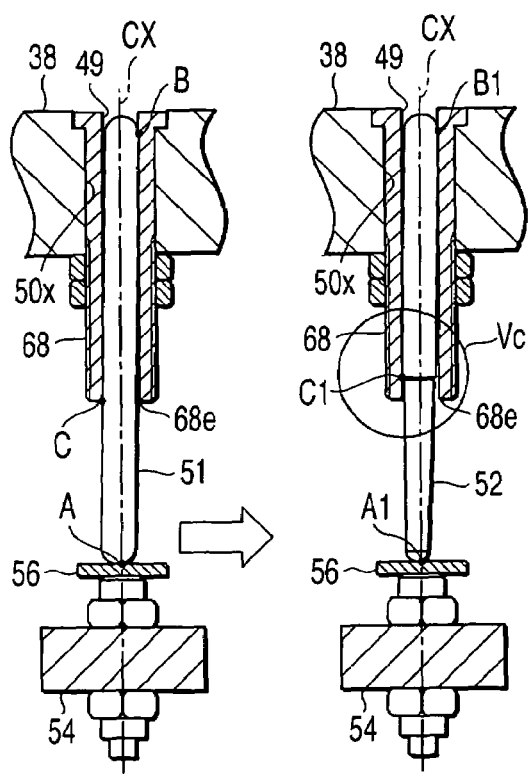
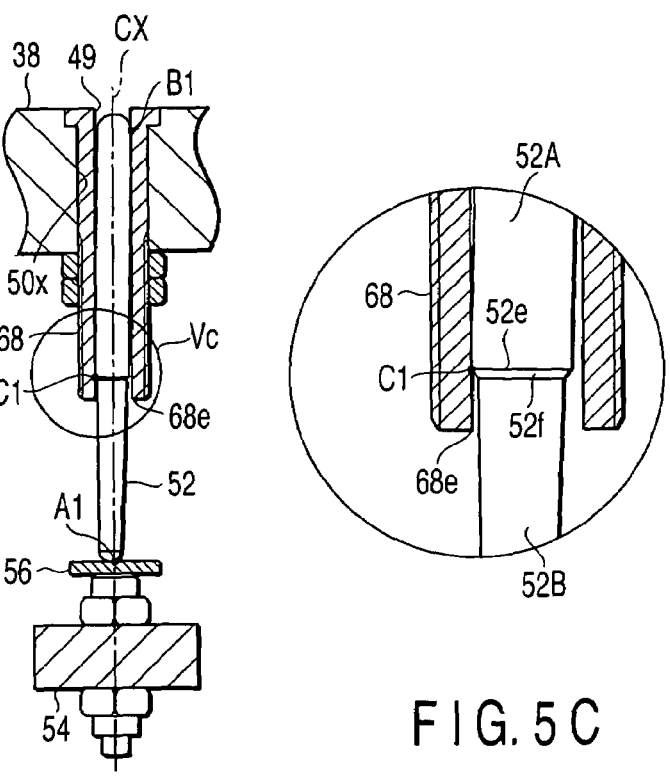
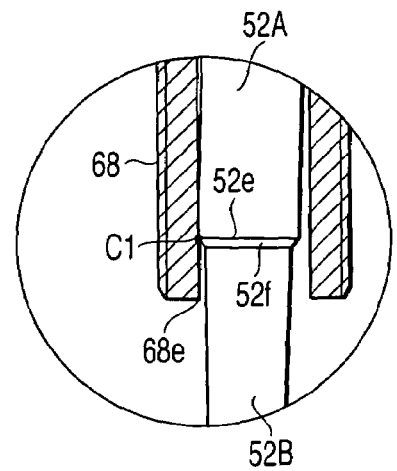
FIG. 5A  FIG. 5B  FIG. 5C

APPARATUS FOR PERFORMING SEMICONDUCTOR PROCESSING ON TARGET SUBSTRATE

TECHNICAL FIELD

The present invention relates to an apparatus which performs a semiconductor process on a target substrate and has an improved substrate lifting mechanism. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

BACKGROUND ART

In the fabrication of semiconductor devices, various semiconductor processes such as film formation, etching, heating, modification, and crystallization are repetitively performed on a target substrate such as a semiconductor wafer. In these semiconductor processes, a target substrate is placed on a worktable (susceptor) which is disposed in a process container, and the substrate is processed in this state. A lifting mechanism is used to transfer the target substrate with respect to the worktable. Generally, a lifting mechanism of this sort has lifter pins arranged one by one in through holes formed in the worktable.

FIG. 8 is a sectional side view showing a portion of a substrate lifting mechanism in a conventional semiconductor processing apparatus. As shown in FIG. 8, a plurality of through holes (guide holes) 150 are formed to vertically extend through a worktable 138. A lifter pin 152 is inserted into each guide hole 150 so as to be able to protrude and retract. The lifter pin 152 is driven by a predetermined driving means to protrude and retract with respect to the mount surface of the worktable 138 (e.g., Jpn. Pat. Appln. KOKAI Publication No. 6-318630).

In this lifting mechanism of a target substrate, a target substrate W is lifted from the mount surface by protruding the lifter pin 152 above the mount surface of the worktable 138 by the driving means. Also, the target substrate W is placed on the mount surface by moving the lifter pin 152 downward. Referring to FIG. 8, the lower end of the lifter pin 152 is supported as it simply abuts against the surface of a pin base 156 attached to a driving member 154. The lifter pin 152 is vertically moved inside the guide hole 150 by vertically moving the driving member 154.

PCT (WO) No. 2002-530847 also discloses a processing apparatus including a substrate lifting mechanism. In the apparatus of this reference, auxiliary pipes for guiding lifter pins are arranged inside through holes formed in a worktable.

DISCLOSURE OF INVENTION

It is an object of the present invention to alleviate inconveniences such as sticking of deposit caused when a gas diffuses to a portion between a lifter pin and a guide hole, in an apparatus which performs a semiconductor process on a target substrate.

According to a first aspect of the present invention, there is provided an apparatus for performing a semiconductor process on a target substrate, comprising:

a process container configured to accommodate the target substrate;

a gas supply system configured to supply a process gas into the process container;

a worktable disposed in the process container, the worktable having an upper surface on which the target substrate is placed, and a lower surface which is exposed inside the process container; and a lifting mechanism configured to assist transfer of the target substrate with respect to the upper surface of the worktable, wherein the lifting mechanism comprises a lifter pin configured to support the target substrate, a driving unit configured to move the lifter pin up and down, and a guide hole configured to guide the lifter pin being moved up and down, the guide hole comprising a main hole portion which extends from the upper surface to the lower surface through the worktable, and an extended hole portion which extends into an extension sleeve which projects downward from the lower surface of the worktable to correspond to the main hole portion.

The length of the extended hole portion of the guide hole is desirably larger than the half length of the main hole portion of the guide hole. In one aspect, the upper end of an auxiliary pipe is attached to the lower surface of the worktable, and the auxiliary pipe as a whole forms the extension sleeve, such that the extended hole portion is formed in the auxiliary pipe. In another aspect, an auxiliary pipe is inserted into a through hole which vertically extends through the worktable, and a portion of the auxiliary pipe, which projects downward from the lower surface of the worktable, forms the extension sleeve, such that the main hole portion and the extended hole portion are formed in the auxiliary pipe.

The driving unit may move the lifter pin up and down between first and second states, and the lifter pin protrudes above the upper surface of the worktable in order to assist transfer of the target substrate in the first state, and retracts below the upper surface of the worktable in order to perform the semiconductor process in the second state.

In the second state of the lifter pin, a lower contact point at which the lifter pin comes in contact with an inner surface of the guide hole is desirably positioned above a lower end portion of the extension sleeve. To this end, the lifter pin may have an upper shaft portion and a lower shaft portion having a diameter smaller than that of the upper shaft portion, and the lower end portion of the upper shaft portion forms the lower contact point.

An annular recess may be formed in the outer surface of the lifter pin. In the second state of the lifter pin, the annular recess is positioned above the lower end portion of the extension sleeve. A longitudinal groove portion may be formed in the outer surface of the lifter pin. In the second state of the lifter pin, the longitudinal groove portion is positioned above the lower end portion of the extension sleeve.

BRIEF DESCRIPTION OF DRAWINGS

FIGS. 4A and 4B are views showing a conventional mechanism and the mechanism according to the third embodiment, respectively, in order to compare the functions and effects of substrate lifting mechanisms;

FIGS. 5A and 5B are views showing a mechanism according to a modification of the third embodiment and the mechanism according to the third embodiment, respectively, in order to compare the functions and effects of substrate lifting mechanisms, and FIG. 5C is a view showing a portion Vc of FIG. 5B in an enlarged scale;

BEST MODE FOR CARRYING OUT THE INVENTION

During the course of development of the present invention, the present inventors studied the problems of a semiconductor processing apparatus having the conventional substrate lifting mechanism as described above. As a consequence, the present inventors obtained the following findings.

Figure 8:
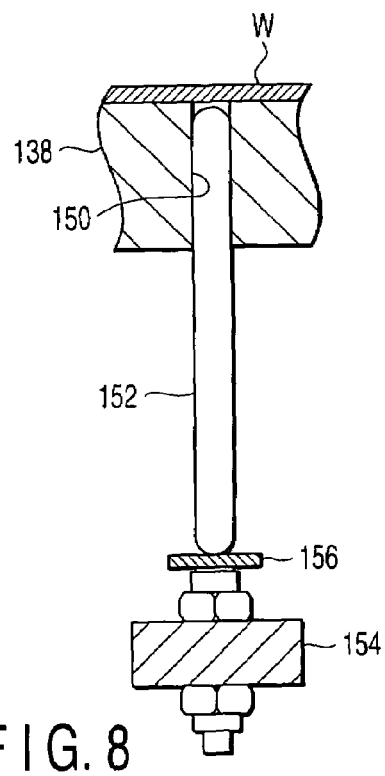
FIG. 8 is a sectional side view showing a portion of a substrate lifting mechanism in a conventional semiconductor processing apparatus.

In the lifting mechanism shown in FIG. 8, a certain clearance is formed between the outer surface of the lifter pin 152 and the inner surface of the through hole (guide hole) 150. This clearance allows the lifter pin 152 to smoothly move up and down in the guide hole 150. However, when a film formation process or the like is performed on the target substrate W, a process gas easily diffuses into the clearance from the lower portion of the worktable 138. This diffusing gas causes deposit to stick to the outer surface of the lifter pin 152 or the inner surface of the guide hole 150. This diffusing gas may also cause deposit to locally stick to the lower surface of the target substrate W, which faces the upper opening of the guide hole.

If the deposit sticks to the outer surface of the lifter pin 152 or the inner surface of the guide hole 150, the outer surface of the lifter pin comes in contact with the inner surface of the guide hole by friction when the lifter pin 152 vertically moves. This produces particles and adversely affects the processing performance, e.g., deteriorates the film quality. In addition, the deposit deteriorates the movability between the lifter pin 152 and guide hole 150. This causes a faulty operation of the lifter pin 152, and damages the lifter pin or worktable by, e.g., the bite of the lifter pin.

On the other hand, if the deposit sticks to the lower surface of the target substrate W, particles are readily produced when the target substrate is unloaded or in subsequent steps. Also, the deposit sticking to the lower surface may produce, e.g., inclination or strain of the target substrate W. In this case, if the target substrate W is to be exposed after that, defocusing of an exposure pattern occurs.

Especially in recent years, as the degree of integration of semiconductor devices increases, the coverage characteristics of the film formation process must be improved (that is, it is necessary to improve the coverage characteristics to form a film even on the inner surface of a hole having a high aspect ratio, e.g., an aspect ratio of 10 or more). This presumably significantly increases the sticking of the deposit caused by the process gas diffusing into the through hole 152, and this is a serious problem in the film formation apparatus.

As a measure to counter the above problem, it is possible to decrease the clearance between the outer surface of the lifter pin 152 and the inner surface of the guide hole 150. In this case, the gas is prevented from diffusing into there, so the sticking of the deposit as described above can be reduced. However, decreasing the clearance allows easy occurrence of a faulty operation of the lifter pin 152. Especially when the deposit sticks to the outer surface of the lifter pin 152 or the inner surface of the guide hole 150, a faulty operation of the lifter pin 152 occurs more easily. This makes it extremely difficult to further decrease the clearance described above in real apparatuses. Presently, this makes apparatus design itself very difficult.

Embodiments of the present invention constructed on the basis of the findings as described above will be explained below with reference to the accompanying drawings. Note that in the following explanation, the same reference numerals denote components having substantially the same functions and arrangements, and a repetitive explanation will be made only when necessary.

First Embodiment

Figure 1:
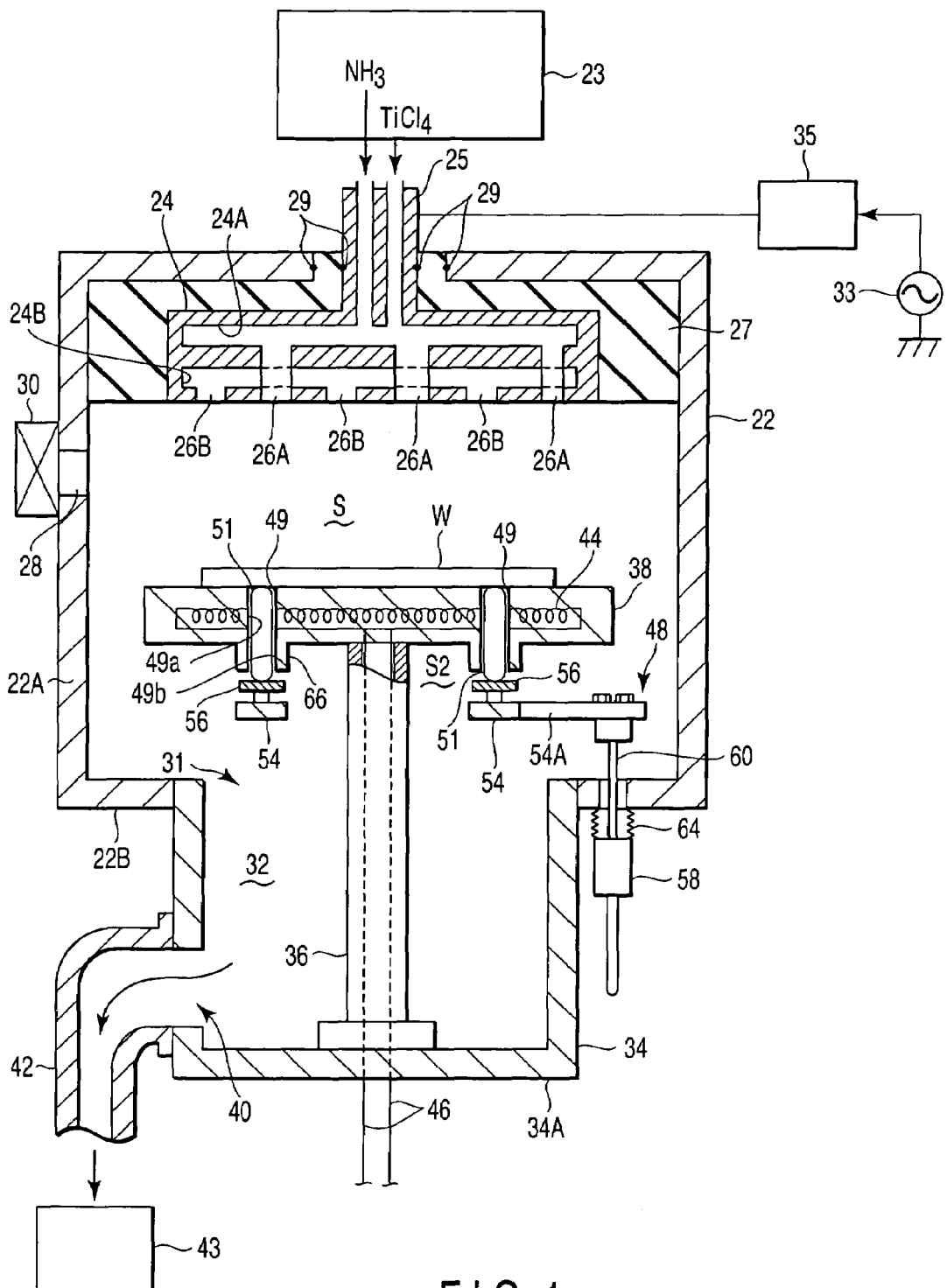
FIG. 1 is a sectional side view showing a semiconductor processing apparatus according to a first embodiment of the present invention.

FIG. 1 is a sectional side view showing a semiconductor processing apparatus according to a first embodiment of the present invention. This semiconductor processing apparatus 20 is constructed as a film formation apparatus which forms a thin TiN film on a target substrate such as a semiconductor wafer.

The processing apparatus 20 has a process chamber 22 made of aluminum or an aluminum alloy. A showerhead 24 for supplying necessary process gases is attached to the ceiling of the process chamber 22. The showerhead 24 is connected to a gas supply unit 23 containing gas sources of process gases such as $TiCl_4$ and $NH_3$ via supply lines 25 which are connected to the top of the showerhead 24. A large number of gas delivery holes 26A and 26B are formed in the lower surface of the showerhead 24. The process gases are delivered from these gas delivery holes into a processing space S.

Two, for example, partitioned gas passages 24A and 24B are formed inside the showerhead 24. The gas passages 24A and 24B communicate with the gas delivery holes 26A and 26B, respectively, so two gases are not mixed inside the showerhead 24. That is, the two gases are delivered into the processing space S through the different passages inside the showerhead 24, and mixed for the first time in the processing space S.

The showerhead 24 is made of a conductor, e.g., nickel or a nickel alloy such as hastelloy, and also functions as an upper electrode. To ensure insulation properties with respect to the process chamber 22, the peripheral surface and upper portion of the showerhead 24 are entirely covered with an insulator 27 such as quartz or alumina. That is, the showerhead 24 is fixed to the process chamber 22 via the insulator 27. Sealing members 29 such as O-rings are interposed between the joint portions between the showerhead 24, insulator 27, and process chamber 22, thereby assuring that the process chamber 22 is airtight.

A RF (Radio Frequency) power supply 33 which generates a RF voltage at, e.g., 450 kHz is connected to the showerhead 24 via a matching circuit 35. The RF power supply 33 and matching circuit 35 supply RF power to the showerhead 24 in accordance with the necessity of processing. Note that the frequency of the RF power supplied by the RF power supply is not limited to the above-mentioned value, and an arbitrary frequency, e.g., 13.56 MHz may also be used. Note also that when TiN is to be formed, the film can be formed only by a thermal reaction without using any RF power.

In the process chamber 22, a worktable 38 supported by a column 36 opposes the showerhead 24. The worktable 38 has an upper surface (mount surface) on which the wafer W is placed and a lower surface which is exposed inside the process chamber 22. The worktable 38 is made of a ceramic material such as AlN, and incorporates a heating means 44 such as a resistance heating type heater. The heating means 44 is connected to feeders 46 arranged in the column 36, and generates heat by electric power supplied via the feeders 46.

A loading/unloading port 28 is formed in a side wall 22A of the process chamber 22. An openable gate valve 30 is attached to the loading/unloading port 28. Below the worktable 38, an opening 31 is formed in a bottom 22B of the process chamber 22. The opening 31 has an opening section smaller than the cross section (planar contour) of the worktable 38, and this opening section is completely contained in the cross section of the worktable 38 when viewed two-dimensionally. With this arrangement, the process gases flow from the peripheral surface toward the bottom of the worktable 38 and evenly flow into the opening 31.

An exhaust space 32 is formed downstream of the opening 31. The exhaust space 32 is formed by a partition 34 which is connected to the bottom 22B. The column 36 is attached to a bottom 34A of the partition 34. The column 36 extends into the processing space S and supports the worktable 38.

An exhaust port 40 formed in the lower side wall of the partition 34 opens in the exhaust space 32. An exhaust line 42 which is connected to an exhaust unit 43 such as a vacuum pump is connected to the exhaust port 40. A pressure adjusting valve (not shown) capable of controlling the opening angle is inserted midway along the exhaust line 42. This pressure adjusting valve is properly controlled in accordance with the pressure inside the process chamber 22. In this manner, the pressure inside the process chamber 22 can be maintained at a constant value, or changed toward a target pressure.

A lifting mechanism 48 for assisting the transfer of the wafer W as a target substrate is incorporated into the worktable 38. The lifting mechanism 48 includes lifter pins 51 which support and vertically move the wafer W (three pins are included in the apparatus shown in FIG. 1; FIG. 1 shows only two of them). The liter pins 51 are made of quartz or a ceramic material such as $Al_2O_3$, $SiO_2$, or AlN. The lifting mechanism 48 also includes guide holes 49 for guiding the lifter pins 51 being moved up and down. The lifter pins 51 are inserted one by one into the guide holes 49 so as to be vertically movable.

The guide hole 49 includes a main hole portion 49a which extends through the worktable 38 from its upper surface to lower surface, and an extended hole portion 49b which extends into an extension sleeve 66 which projects downward from the lower surface of the worktable 38. The length of the extended hole portion 49b is set to be larger than the half length of the main hole portion 49a. As will be described later, the main hole portion 49a can be the through hole itself formed in the worktable 38, or a portion of an auxiliary pipe inserted into the worktable 38.

The lifter pin 51 has an upper portion which is inserted into the guide hole 49, and a lower portion which projects downward from the extension sleeve 66. The lower end portion of each lifter pin 51 always abuts against a support plate 56 attached to a frame 54. The frame 54 has an arm 54A connected and fixed to a driving rod 60 of an actuator 58 positioned below the process chamber bottom 22B.

That is, the frame 54, support plate 56, actuator 58, and driving rod 60 form a driving unit for the lifter pin 51. An expansion bellows 64 is formed outside a portion where the driving rod 60 extends through the process chamber bottom 28B. The bellows 64 ensures that the process chamber 22 is airtight at the portion through which the driving rod 60 extends.

The lower end portion of the lifter pin 51 is preferably always supported in contact with a driving surface of the support plate 56, while it is separable from the driving surface. Since this lower end portion of the lifter pin 51 is not fixed, a stress generated by thermal expansion or the like can be released by the movement of the lower end portion of the lifter pin 51. It is also possible to further reduce damage to the lifter pin 51 or guide hole 49.

The function of the processing apparatus 20 arranged as described above will be explained below. First, a wafer W is held by a transfer arm (not shown) and loaded into the process chamber 22 through the opened gate valve 30 and the loading/unloading port 28. In this state, the lifter pins 51 protrude from the mount surface of the worktable 38. This state is obtained when the frame 54 and support plate 56 are raised by driving of the actuator 58, thereby pushing the lifter pins 51 upward. Then, the transfer arm transfers the wafer W onto the upper ends of a plurality of lifter pins 51.

Then, the frame 54 and support plate 56 are moved down by driving of the actuator 58. In this manner, the lifter pins 51 also move down by the load of the wafer W and their own weights. When the lifter pins 51 move down and retract below the mount surface, the wafer W on the lifter pins 51 is placed on the mount surface of the worktable 38. While the lifter pins 51 are placed below the mount surface, the following semiconductor process (film formation process) is performed.

In the film formation process, process gases, e.g., $TiCl_4$ and $NH_3$ are delivered from the delivery holes 26A and 26B of the showerhead 24. The process gases are mixed in the processing space S and thermally react with each other to form a thin TiN film on the surface of the wafer W. In this film formation, the worktable 38 is set at a temperature, e.g., 400° C. to 700° C., at which the thermal reaction can occur. The pressure of the processing space S (the pressure inside the process chamber) is set at, e.g., 40 to 1,333 Pa (300 mTorr to 10 Torr). The film formation may be performed while generating plasma in the processing space S by applying RF power between the showerhead 24 as an upper electrode and the worktable 38 as a lower electrode.

During the film formation described above, the process gases pass through the peripheral surface of the worktable 38 and flow down to a lower space S2 below the lower surface 38b of the worktable 38, and is finally exhausted from the exhaust port 40. In this state, a portion of the process gases in the lower space S2 diffuses into the gap (lower end introduction position) between the outer surface of the lifter pin 51 and the lower end of the guide hole 49. Therefore, deposit sticks, although slightly, in a clearance formed around the lifter pin 51 in the guide hole 49.

The partial pressure of gas around the lifter pin 51 in the guide hole 49 decreases in accordance with the distance from the lower end introduction position, and the sticking amount of the deposit also decreases in accordance with this distance. In the present invention, therefore, the length of the guide hole 49 (the sum of the main hole portion 49a and extended hole portion 49b) is increased by adding the extension sleeve 66. This decreases the partial pressure of gas and the sticking amount of the deposit in the upper portion of the guide hole 49, when compared to a case in which the extension sleeve 66 is not formed.

For example, when the film formation process is performed at a pressure of 666.5 Pa (5 Torr) or more (under high-coverage film formation conditions), the partial pressure of gas in the guide hole 49 also increases. In this case, the sticking amount of the deposit in the guide hole 49 may increase as a whole. Even in a case like this, however, the length of the guide hole 49 is increased by the extension sleeve 66, so the partial pressure of gas in the upper portion of the guide hole 49 well decreases. As a consequence, no deposit sticks to the upper portion of the guide hole 49 and the upper portion of the lifter pin 51.

Second Embodiment

Figure 2:
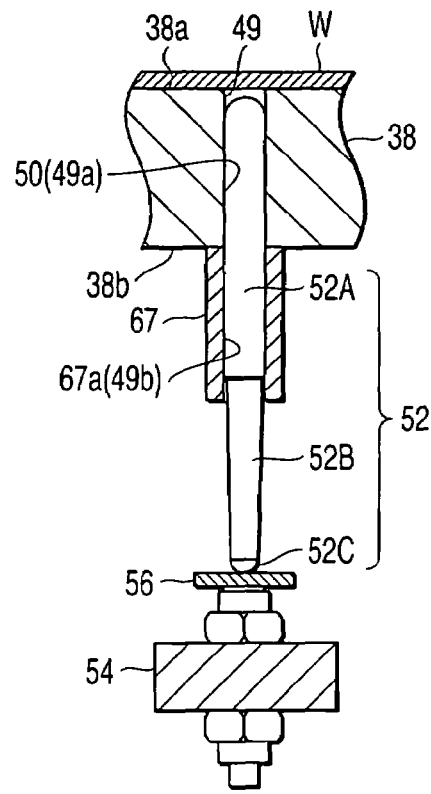
FIG. 2 is a sectional side view showing a portion of a substrate lifting mechanism according to a second embodiment applicable to the semiconductor processing apparatus shown in FIG. 1.

FIG. 2 is a sectional side view showing a portion of a substrate lifting mechanism according to a second embodiment applicable to the semiconductor processing apparatus shown in FIG. 1. In the second embodiment, a through hole 50 is formed in a worktable 38 to extend from its upper surface to lower surface, and the through hole 50 itself forms a main hole portion 49a of a guide hole 49. Also, the upper end of an auxiliary pipe 67 is attached to the lower surface of the worktable 38 to correspond to each through hole 50, and the whole auxiliary pipe 67 functions as an extension sleeve 66 (FIG. 1). That is, an extended hole portion 49b (FIG. 1) of a guide hole 49 is formed by an axial hole 67a of the auxiliary pipe 67.

The auxiliary pipe 67 is made of a ceramic material such as $Al_2O_3$, $SiO_2$, or AlN. The auxiliary pipe 67 is formed separately from the worktable 38, and integrally bonded by direct bonding to the lower surface of the worktable 38 to correspond to the through hole 50. When the bonding method using direct bonding is to be used, the auxiliary pipe 67 is preferably made of the same material (e.g., AlN) as the lower surface of the worktable 38. The direct bonding can be performed by heating the cleaned surfaces to a high temperature as they are brought into contact with each other by pressure.

The auxiliary pipe 67 is placed coaxially with the through hole 50, and projects downward from a lower surface 38b of the worktable 38. The shape and area of the opening section of the axial hole 67a (i.e., the extended hole portion 49b (FIG. 1)) of the auxiliary pipe 67 are substantially equal to the shape and area of the opening section of the through hole 50. In this way, the clearance between a lifter pin 52 and the axial hole 67a is set to be substantially the same as the clearance between the lifter pin 52 and the through hole 50. Accordingly, the lifter pin 52 is vertically guided by both the through hole 50 and auxiliary pipe 67.

Unlike the lifter pin 51, the lifter pin 52 has a substantially columnar upper shaft portion 52A, a lower shaft portion 52B connected to the lower portion of the upper shaft portion 52A, and a lower end portion 52C formed below the lower shaft portion 52B. The lower shaft portion 52B has a diameter slightly smaller than that of the upper shaft portion 52A, and has a tapered shape which gradually reduces its diameter (i.e., reduces its cross-sectional area) downward. The lower end portion 52C of the lifter pin 52 has at least a projecting shape such as a spherical shape, and is supported in contact with the surface of a support plate 56, while it is separable from the surface.

The taper angle of the lower shaft portion is so set that the outer surface of the lower shaft portion 52B does not come into contact with the inner edge of the lower end of the auxiliary pipe 67 within the operating range of the lifter pin 52. Also, the outer diameter of the lower shaft portion 52B is so set that the outer surface of the lower shaft portion 52B does not come into contact with the inner edge of the lower end of the auxiliary pipe 67 within the operating range of the lifter pin 52. On the other hand, the upper shaft portion 52A ensures good movability to the guide hole 49. Therefore, the upper shaft portion 52A and lower shaft portion 52B desirably have the same type sectional shape (i.e., a columnar shape or square pillar shape) in the axial direction.

Note that the lifter pin 52 and support plate 56 are preferably made of the same material. In this embodiment, all of the lifter pin 52, the support plate 56, and a frame 54 are made of a ceramic material such as $Al_2O_3$.

Third Embodiment

Figure 3:
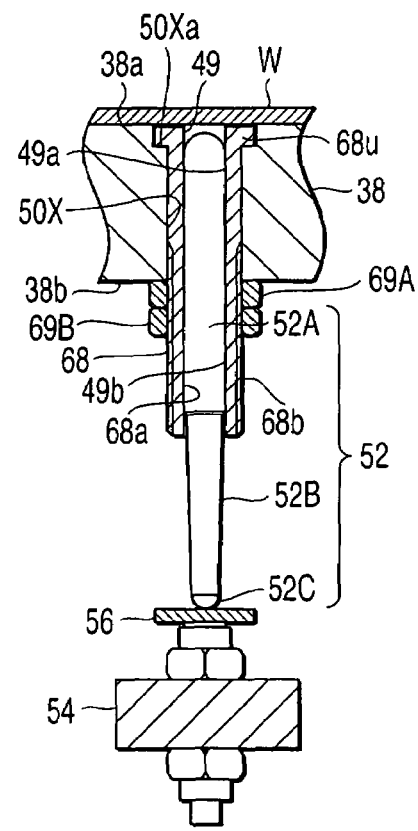
FIG. 3 is a sectional side view showing a portion of a substrate lifting mechanism according to a third embodiment applicable to the semiconductor processing apparatus shown in FIG. 1.

FIG. 3 is a sectional side view showing a portion of a substrate lifting mechanism according to a third embodiment applicable to the semiconductor processing apparatus shown in FIG. 1. In the third embodiment, a through hole 50X is formed in a worktable 38 to extend from its upper surface to lower surface, and an auxiliary pipe 68 is inserted into the through hole 50X. That portion of an axial hole 68a of the auxiliary pipe 68, which is positioned in the worktable 38, forms a main hole portion 49a of a guide hole 49. Also, that portion of the axial hole 68a of the auxiliary pipe 68, which projects downward from the lower surface of the worktable 38, forms an extended hole portion 49b of the guide hole 49.

As shown in FIG. 3, a step 50Xa is formed in the through hole 50X. The step 50Xa is positioned close to (immediately below) the upper opening of the through hole 50X. The step 50Xa has a step surface which faces up. On the other hand, the auxiliary pipe 68 has the axial hole 68a in the upper end portion, and a flange 68u which can engage with the step 50Xa. The auxiliary pipe 68 is inserted into the through hole 50X with the flange 68u being engaged with the step 50Xa. The auxiliary pipe 68 projects downward from the lower end of the through hole 50X.

Fixing members (threaded members, i.e., nuts) 69A and 69B are attached to the outer surface of that portion of the auxiliary pipe 68, which projects downward from the lower surface of the worktable 38. More specifically, a screw structure 68b is formed on the lower portion of the auxiliary pipe, and the fixing members threadably engage with the screw structure 68b. The fixing member 69A abuts against the lower surface of the worktable 38, and the worktable 38 is clamped by the flange 68u of the auxiliary pipe 68 and the fixing member 69A. In this manner, the auxiliary pipe 68 is fastened to the worktable 38. The fixing member (lock nut) 69B is attached to prevent looseness of the fixing member 69A. Note that any fixing members can be used as long as they can fix the auxiliary pipe 68.

The auxiliary pipe 68 is inserted into the through hole 50X, and projects downward from inside the through hole 50X. This facilitates the operation of attaching and positioning the auxiliary pipe 68 with respect to the worktable 38. In addition, the attaching strength of the auxiliary pipe 68 can be increased.

Also, the auxiliary pipe 68 is detachably fixed to the worktable 38 by engagement of the step 50Xa and flange 68u and engagement of the worktable 38 and fixing member 69A. Accordingly, the auxiliary pipe 68 can be replaced and cleaned, and this improves the maintenance properties.

Furthermore, the lifter pin 52 is guided only by the auxiliary pipe 68 and comes in slidable contact only with the inner surface of the auxiliary pipe 68. Therefore, the auxiliary pipe 68 alone receives damage caused by the lifter pin 52. That is, the expensive worktable 38 is not damaged.

Functions of First to Third Embodiments

Functions and effects common to the first to third embodiments will be explained in detail below. FIGS. 4A and 4B are views showing a conventional mechanism and the mechanism according to the third embodiment, respectively, in order to compare the functions and effects of substrate lifting mechanisms. Note that FIG. 4B shows only the third embodiment, but similar effects can be obtained by the first and second embodiments.

In each of the above embodiments, the guide hole 49 is made up of the main hole portion 49a positioned in the worktable 38, and the extended hole portion 49b which extends downward from the main hole portion 49a. Accordingly, a length $LP_1$ of the guide hole 49 is the sum of a length LP (which is the same as a length LP of a conventional guide hole 150) of the main hole portion 49a and a length $LP_2$ of the extended hole portion 49b. The length $LP_2$ is preferably LP/2 or more. With this arrangement, in the guide hole 49, the partial pressure of gas is lower than the conventional partial pressure of gas in the upper portion of the clearance even when the gas enters from a lower end introduction position G. Consequently, no deposit easily sticks to the outer surface of the upper portion of the lifter pin 52 and the inner surface of the upper portion of the guide hole 49. Also, the sticking of the deposit to the lower surface portion (the portion which faces the upper opening of the guide hole 49) of the wafer W is reduced or eliminated.

Especially because the sticking amount of the deposit in the upper portion of the lifter pin is reduced, it is possible to greatly reduce particles harmful to the process which are produced when the lifter pin projects. That is, it is possible to suppress an event in which the deposit sticking to the upper portion of the lifter pin 52 or the inner surface of the upper portion of the guide hole 49 flies over the mount surface of the worktable 38. It is also possible to prevent sticking of the deposit to the lower surface of the wafer W. This makes it possible to further reduce the particles, and eliminate inconveniences in the subsequent steps of the wafer W. For example, in a photolithography step, if the wafer W warps due to the deposit sticking to a portion of the lower surface, defocusing of an exposure pattern may locally occur.

Also, the lifter pin 52 is vertically guided by the guide hole 49 having the length $LP_1$ which is substantially larger by $LP_2$ than that of the conventional structure. This improves the movability of the lifter pin 52 when it vertically moves. For example, even when the clearance between a lifter pin 152 and the guide hole 150 of the conventional structure and a clearance CR between the lifter pin 52 and guide hole 49 are the same, the inclination angle of the lifter pin 52 is decreased because the guide length of the lifter pin 52 is longer by $LP_2$. Accordingly, the lifter pin 52 can vertically move more smoothly than the liter pin 152 of the conventional structure.

The longer the length $LP_2$ of the extended hole portion 49b of the guide hole 49, the more notable the effect described above. However, it is necessary to increase the length of the lifter pin and increase the vertical dimension of the process chamber 22 accordingly. Therefore, it is desirable to set the length $LP_2$ of the extended hole portion 49b in accordance with the contents of processing.

For example, when the coverage characteristics of the film formation process correspond to an aspect ratio AP, the apparatus is designed such that LP/CR>AP holds for the clearance CR between the lifter pin 52 and guide hole 49 and the distance LP. This makes it possible to reduce the deposit sticking to the lower surface of the wafer W, which faces the upper opening of the guide hole 49. Assume, for example, that the length of the main hole portion LP of the guide hole 49 is 18 mm, the clearance CR is 0.2 mm throughout the whole circumference, and the length $LP_2$ of the extended hole portion 49b of the guide hole 49 is 15 mm. In this case, if the extended hole portion 49b does not exist, LP/CR=90, i.e., LP/CR is smaller than aspect ratio AP=100. When the extended hole portion 49b exists, $LP_1$/CR=165, i.e., $LP_1$/CR is much larger than aspect ratio AP=100.

Note that the same effect as described above can also be obtained by increasing the thickness of the worktable 38, thereby increasing the length of the through hole 50 itself. If the thickness of the worktable 38 is increased, however, it is necessary to use a large amount of an expensive ceramic material and machine the long through hole 50. This largely increases the fabrication cost. Also, increasing the thickness of the worktable 38 makes it difficult to control the temperature of the mount surface by the heating means 44 (or a cooling means), thereby decreasing the temperature uniformity and adversely affecting the uniformity of the film formation process as well. In addition, since the heat capacity of the worktable increases, the cycle time of heating/cooling increases, and this decreases the processing efficiency.

FIGS. 5A and 5B are views showing a mechanism according to a modification of the third embodiment and the mechanism according to the third embodiment, respectively, in order to compare the functions and effects of substrate lifting mechanisms and FIG. 5C is a view showing a portion Vc of FIG. 5B in an enlarged scale.

In the third embodiment shown in FIG. 5B, the lifter pin 52 has a shape made up of the columnar upper shaft portion 52A and tapered lower shaft portion 52B. On the other hand, in the modification shown in FIG. 5A, a lifter pin 51 has a substantially straight shape (i.e., a shape which does not change the shape and area of its cross section when viewed in the axial direction). Between the lifter pin 51 or 52 and the guide hole 49, the clearance CR always exists to allow the lifter pin 51 or 52 to be moved up and down. When the lifter pin 51 or 52 is free from the driving means, therefore, the axis of the lifter pin 51 or 52 inclines, although slightly, to an axis CX of the guide hole 49.

FIG. 5A shows a state in which the straight lifter pin 51 vertically moves and inclines as described above. In this state, a contact support point A between the lower end portion of the lifter pin 51 and the support plate 56 slightly deviates from the axis CX of the guide hole 49. Also, the lifter pin 51 comes in contact with the guide hole 49 at an upper contact point B and lower contact point C. If the frame 54 is raised in this state, the support plate 56 applies an upward pushing force to the lifter pin 51. However, the lifter pin 51 does not rise but bites while the contact points A, B, and C are fixed. In some cases, the lifter pin 51 or auxiliary pipe 68 is damaged at the lower contact point B.

In order for the lifter pin 51 to rise in this state, the contact support point A must move on the support plate 56 in a direction indicated by an arrow in FIG. 5A (i.e., must move closer to the axis CX), thereby changing the inclination angle of the lifter pin 51. In this case, the liter pin 51 can rise if the contact support point A can easily move in the direction of the arrow by the upward pushing force of the support plate 56. However, the sliding resistance of the lifter pin 51 at the contact support point A on the support plate 56 is high, although it depends upon the surface roughness of the contact surface of the contact support point A. If the contact support point A does not move, the lifter pin 51 causes a faulty operation as described above.

On the other hand, as shown in FIG. 5C, in the lifter pin 52, a step 52f is formed between the upper shaft portion 52A and lower shaft portion 52B. The lower shaft portion 52B below the step 52f has a diameter smaller than that of the upper shaft portion 52A, and has a tapered shape which decreases its diameter downward. A boundary 52e between the upper shaft portion 52A and lower shaft portion 52B is positioned in the guide hole 49 (i.e., above a lower end inner edge 68e of the auxiliary pipe 68) even when the lifter pin 52 is in the lower-limiting position (the position shown in FIG. 5C) of its operating range. Note that the lower shaft portion 52B may also be formed straight downward below the step 52f.

FIG. 5B shows a state in which the lifter pin 52 comes in contact with three points, i.e., a contact support point A1 with respect to the support plate 56, an upper contact point B1, and a lower contact point C1. As described above, the contact support point A1 deviates from the axis CX. The lower contact point C1 of the lifter pin 52 moves upward in synchronism with the rise of the frame 54. In this state, the lifter pin 52 can rise while the contact support point A1 remains unmoved on the support plate 56. This is so because the outer surface of the lifter pin 52 does not abut against the lower end inner edge 68e of the auxiliary pipe 68 while the lifter pin 52 is rising.

That is, the lifter pin 52 has a structure in which the diameter of the lower shaft portion 52B is made smaller than that of the upper shaft portion 52A, and the lower shaft portion 52B has a tapered shape which decreases its diameter downward. Therefore, the lifter pin 52 does not come in contact with the lower end inner edge 68e until the upper-limiting position of its operating range. This allows the lifter pin 52 to keep rising to the upper-limiting position of its operating range while maintaining its inclined attitude.

In the third embodiment as described above, the lower shaft portion 52B of the lifter pint 52 is so designed as not to come in contact with the lower end portion of the guide hole 49. To this end, it is necessary to set the step amount of the step 52f and the taper angle of the lower shaft portion 52B in accordance with the conditions such as the operating range of the lifter pin 52, the clearance CR, and the distance LP.

The clearance CR is very small (e.g., about 0.2 mm throughout the entire circumference) as described above, and the inclination angle of the lifter pin is also small. Therefore, the step amount of the step 52f and the taper angle of the lower shaft portion 52B normally need only have small values, although they also depend upon the operating range of the lifter pin. For example, the step amount is about 0.1 to 1.0 mm, and the taper angle is about 0.5° to 3.0°.

In the first to third embodiments, the guide length of the lifter pin is increased because the guide hole 49 includes the extended hole portion 49b which is formed by the extension sleeve 66 (the auxiliary pipes 67 and 68 in the second and third embodiments, respectively). Therefore, the inclination angle of the lifter pin becomes smaller than that of the conventional structure for the same clearance CR. Consequently, no faulty operation of the lifter pin readily occurs even in the modification as shown in FIG. 5A (e.g., even when the straight lifter pin 51 is used). Note that in this case, a load is imposed on the auxiliary pipe 68 in the state shown in FIG. 5A in which a faulty operation readily occurs. Accordingly, an arrangement like the third embodiment (i.e., an arrangement using the lifter pin 52) is desirable.

Note that depending on the above-mentioned conditions or the step amount of the step 52f, an operation as described above is possible even when the step 52f alone is formed and the lower shaft portion 52B is not tapered but straight. Note also that depending on the above-mentioned conditions or the taper angle, an operation as described above is possible only by tapering the lower shaft portion 52B without forming the step 52f. In the latter case, it is desirable to give an appropriate radius of curvature to the boundary (the start point of the tapered shape) between the upper shaft portion 52A and lower shaft portion 52B.

The length of the upper shaft portion 52A of the lifter pin 52 is set to be substantially equal to or shorter than the length of the guide hole 49. The length of the lower shaft portion 52B is so set that when the lifter pin 52 is in the upper-limiting position, the step 52f between the upper shaft portion 52A and lower shaft portion 52B does not protrude above the mount surface of the worktable 38.

Fourth Embodiment

Figure 6A:
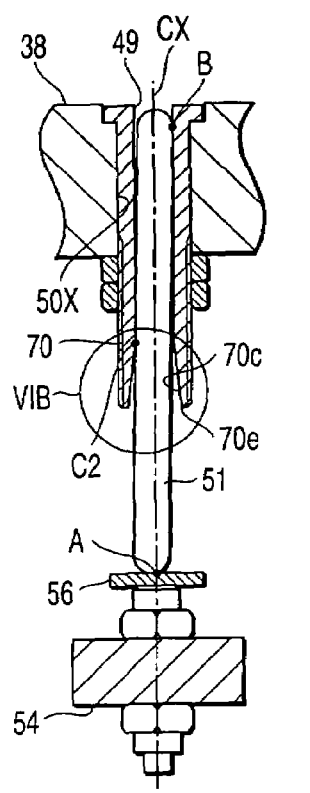
FIG. 6A is a sectional side view showing a portion of a substrate lifting mechanism according to a fourth embodiment applicable to the semiconductor processing apparatus shown in FIG. 1.
Figure 6B:
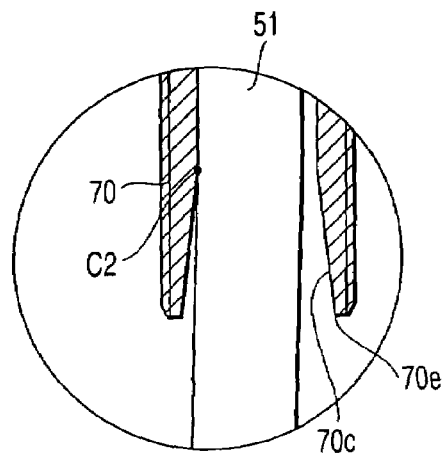
FIG. 6B is a view showing a portion VIB of FIG. 6A in an enlarged scale.

FIG. 6A is a sectional side view showing a portion of a substrate lifting mechanism according to a fourth embodiment applicable to the semiconductor processing apparatus shown in FIG. 1. FIG. 6B is a view showing a portion VIB of FIG. 6A in an enlarged scale. In the fourth embodiment, a lifter pin 51 has a substantially straight shape, and the inner surface near the lower end portion of an auxiliary pipe 70 flares downward. Even in this structure, the lifter pin 51 can smoothly vertically move in the auxiliary pipe 70.

That is, the auxiliary pipe 70 has a shape in which a lower inner surface 70c opens downward into a tapered shape or trumpet shape. In this case, a lower contact point C2 of the outer surface of the lifter pin 51 is positioned on the inner surface above a lower end inner edge 70e of the auxiliary pipe 70. Therefore, the lifter pin 51 does not undergo any large counterforce at the lower contact point C2 while rising. As a consequence, it is possible to prevent the bite of the lifter pin 51 or damage to the lifter pin 51 or auxiliary pipe 70.

Fifth Embodiment

Figure 7:
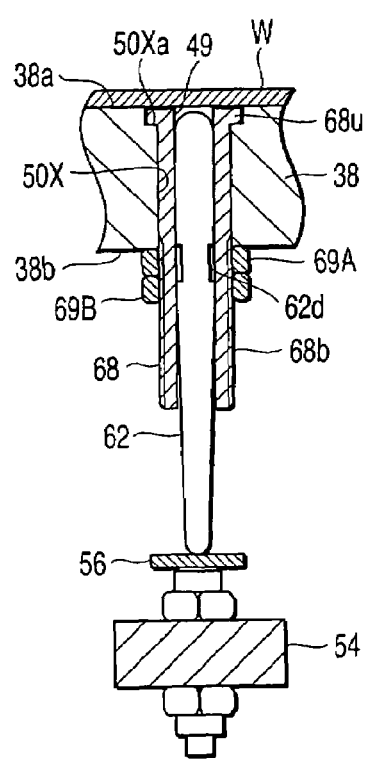
FIG. 7 is a sectional side view showing a portion of a substrate lifting mechanism according to a fifth embodiment applicable to the semiconductor processing apparatus shown in FIG. 1.

FIG. 7 is a sectional side view showing a portion of a substrate lifting mechanism according to a fifth embodiment applicable to the semiconductor processing apparatus shown in FIG. 1. In the fifth embodiment, a lifter pin 62 is similar to the lifter pin 52 of the third embodiment, but has an annular recess 62d formed in the middle portion of its outer surface in the annular direction. The mechanism of the fifth embodiment is the same as the third embodiment except for the lifter pin 62.

In the process chamber 22 which performs a film formation process, when the partial pressure of the process gas decreases to a certain degree, the reaction sometimes intensively progresses to produce deposit. A situation like this occurs more easily in a film formation process having low-coverage characteristics (in this case, the process is a low-pressure process in which the pressure inside the process chamber 22 is as relatively low as 20 to 80 Pa) than in a film formation process having high-coverage characteristics to which the second and third embodiments are advantageously applicable (in this case, the pressure inside the process chamber 22 is as relatively high as 93.3 to 1,333 Pa (about 0.7 to 10 Torr)).

In an environment in which this situation occurs, the partial pressure of gas which enters from the lower end introduction position G shown in FIG. 4B decreases as the gas advances to the upper portion of the clearance. At a predetermined distance from the lower end introduction position G, therefore, deposit collectively sticks to the outer surface of the lifter pin 52 and the inner surface of the guide hole 49. In this case, the large amount of deposit which locally sticks causes a faulty operation of the lifter pin 52.

In the fifth embodiment, the annular recess 62d is formed in a predetermined position in the axial direction of the outer surface of the lifter pin 62 in accordance with the environment such as the film formation conditions or the structure of the worktable and its vicinity. In this case, the deposit collectively sticks to the inside of the annular recess 62d, so a faulty operation of the lifter pin 62 caused by the sticking deposition can be prevented.

The annular recess 62d is formed in that portion of the lifter pin 62, which is positioned inside the guide hole 49 during processing. This portion is separated upward by a predetermined distance from the lower end introduction position G, and the predetermined distance changes in accordance with the processing environment as described above. Therefore, the predetermined distance is appropriately set for each processing environment.

In the first to fifth embodiments, that portion of the outer surface of each of the lifter pins 51, 52, and 62, which is in slidable contact with the inner surface of the guide hole 49 is smoothened compared to the conventional lifter pin.

Conventionally, the outer surface of the lifter pin is roughened or is not particularly polished in order to prevent easy peeling of deposit sticking to the outer surface of the lifter pin. A surface roughness Ra of the outer surface of the conventional lifter pin is approximately 1.5 μm or more. This value is so set that when the lifter pin rises and protrudes above the mount surface of the worktable, deposit sticking to the upper portion of the lifter pin does not peel off. If the deposit peels off, particles are released over the mount surface of the worktable, and this worsens the processing environment.

On the other hand, in the first to fifth embodiments, almost no deposit sticks to the upper portion of the lifter pin, and this greatly decreases the possibility that particles are released over the worktable. Accordingly, even when the outer surfaces of the lifter pints 51, 52, and 62 are smoothened, no deposit peels off from the upper portions of these lifter pins. By thus smoothening the surface, it is possible to decrease the sliding resistance of the lifter pin and further decrease the probability of occurrence of a faulty operation of the lifter pin.

As an example of the above embodiments, all portions of a lifter pin except for the lower end portion (the portion in contact with the pin base) was smoothened by lapping to obtain a lifter pin having a surface roughness Ra of about 0.2 to 0.3 μm. The effect of surface smoothening appears when the surface roughness Ra of the lifter pin is 1.0 μm or less, and a more remarkable effect is obtained when the surface roughness Ra is 0.5 μm or less. Note that the surface roughness Ra of ceramic products is difficult to decrease. From the foregoing, it is most desirable to set the surface roughness Ra of the lifter pin within the range of 0.1 to 0.5 μm.

It is also possible to smoothen the inner surface of the guide hole such that the surface roughness Ra is 1 μm or less. Accordingly, the lifter pin can be guided and moved up and down smoothly. As described above, the surface roughness Ra of the inner surface of the guide hole is also more preferably 0.5 μm or less. From the foregoing, the surface roughness of the guide hole is desirably set within the range of 0.1 to 0.5 μm.

Sixth Embodiment

Figure 9D:
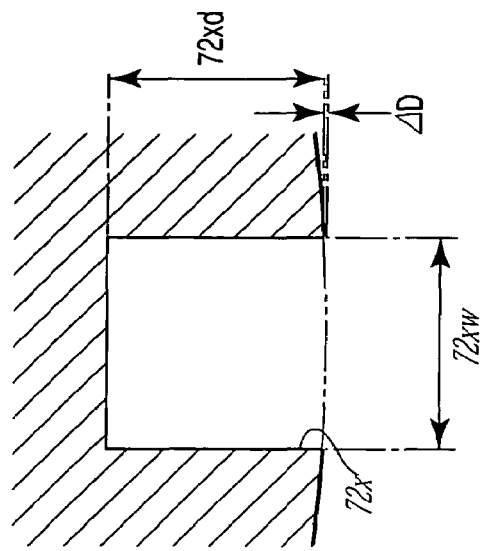
FIG. 9D is a view showing a portion IXD of FIG. 9C in an enlarged scale.
Figure 9C:
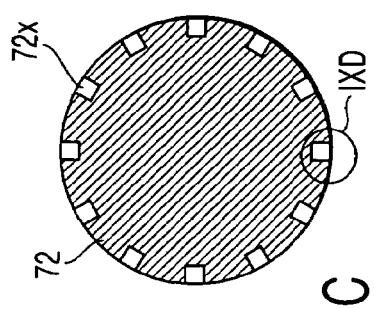
FIG. 9C is a cross-sectional plan view of the lifter pin of the mechanism according to the sixth embodiment.
Figure 9B:
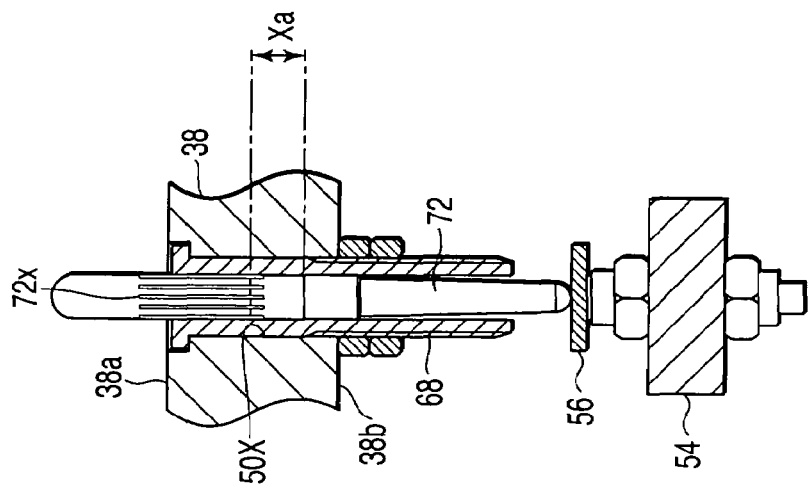
FIG. 9B is a sectional side view showing a state in which a lifter pin of the mechanism according to the sixth embodiment is raised.
Figure 9A:
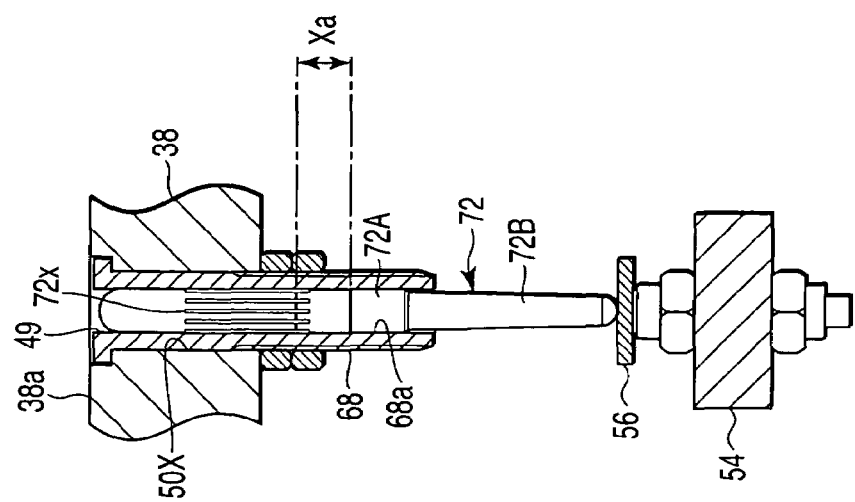
FIG. 9A is a sectional side view showing a portion of a substrate lifting mechanism according to a sixth embodiment applicable to the semiconductor processing apparatus shown in FIG. 1.

FIG. 9A is a sectional side view showing a portion of a substrate lifting mechanism according to a sixth embodiment applicable to the semiconductor processing apparatus shown in FIG. 1. FIG. 9B is a sectional side view showing a state in which a lifter pin of the mechanism according to the sixth embodiment is raised. FIG. 9C is a cross-sectional plan view of the lifter pin of the mechanism according to the sixth embodiment. FIG. 9D is a view showing a portion IXD of FIG. 9C in an enlarged scale. In the sixth embodiment, a lifter pin 72 is similar to the lifter pin 52 of the third embodiment, but has surface grooves 72x formed in its outer surface along the longitudinal direction. The mechanism of the sixth embodiment is the same as the third embodiment except for the lifter pin 72.

Note that surface grooves (to be described later) and arrangements according to their characteristics of sixth embodiment and the seventh and eighth embodiments (to be described later) are similarly applicable to the first and second embodiments and other embodiments. Note also that the following characteristics can be incorporated regardless of whether a guide hole into which a lifter pin is inserted is entirely made of an auxiliary pipe inserted into a worktable 38, or is made of a combination of a through hole formed in the worktable 38 and the auxiliary pipe.

As shown in FIG. 9A, the surface grooves 72x are formed along the longitudinal direction in the peripheral surface of the lifter pin 72. The surface grooves 72x are spaced in the annular direction of the lifter pin 72. More specifically, the surface grooves 72x are formed at equal angular intervals around the axis of the lifter pin 72. The surface grooves 72x preferably extend downward to that region Xa of the peripheral surface of the lifter pin 72, in which deposit presumably sticks most. In the example shown in FIG. 9A, the surface grooves 72x are formed to reach the region Xa from above.

Also, as shown in FIG. 9A, the surface grooves 72x are preferably formed from the upper portion to the middle portion of that portion of the lifter pin 72, which is positioned in an axial hole 68a when the distal end of the lifter pin 72 retracts inside the axial hole 68a (the position of the lifter pin during film formation). Furthermore, as shown in FIG. 9B, when the lifter pin 72 rises, the upper portions of the surface grooves 72x preferably protrude from the upper surface of the worktable 38. In the sixth embodiment, the lifter pin 72 has an upper shaft portion 72A and lower shaft portion 72B, and the surface grooves 72x are formed in the peripheral surface of the upper shaft portion 72A.

As shown in FIGS. 9C and 9D, each surface groove 72x opens to the peripheral surface of the lifter pin 72. The surface grooves 72x increase the sectional area of the space between the lifter pin 72 and an auxiliary pipe 68. Therefore, when deposit is to be removed by supplying a cleaning gas into the process container in a cleaning step, the partial pressure of the cleaning gas can be increased in the depths of the clearance. This makes it possible to more efficiently remove the deposit sticking to the lifter pin 72 and the inner surface of the auxiliary pipe 68.

In particular, a large amount of deposit sticks to the region Xa of the lifter pin 72. It is difficult for any conventional mechanism to remove the deposit in the region Xa. In the sixth embodiment, the surface grooves 72x extend toward the region Xa (more specifically, reach the region Xa), so the partial pressure of the cleaning gas in the region Xa can be raised. This makes efficient removal of the deposit possible.

For example, when a TiN film is to be formed by using $TiCl_4$ and $NH_3$ as reaction gas species, $ClF_3$, $NF_3$, or the like can be used as a cleaning gas in a cleaning step. This cleaning step is performed when the amount of deposit in the process container increases to some extent. After the cleaning step, it is preferable to perform a pre-coating process which deposits the film formation materials to a certain degree in the process container by supplying the reaction gas species without placing any substrate on the worktable. After that, a normal film formation process is performed.

In the cleaning step, as shown in FIG. 9B, the upper portions of the surface grooves 72x are projected above the worktable 38. This allows the cleaning gas to readily diffuse between the lifter pin 72 and auxiliary pipe 68 through the surface grooves 72x. Note that the vertical position of the lifter pin 72 may also be changed during this cleaning step.

By setting a large clearance between the lifter pin and guide hole, the partial pressure of the cleaning gas in this clearance can be raised. To this end, it is possible to simply decrease the diameter of the lifter pin, or increase the diameter of the axial hole. In this method, however, the inclination angle (tilt angle) of the lifter pin increases because the clearance increases. In this case, the sliding resistance of the lifter pin increases, or a defective operation of the lifter pin readily occurs.

By contrast, in the sixth embodiment, the partial pressure of the cleaning gas can be increased only by forming the surface grooves 72x on the lifter pin 72. In this case, the inclination angle of the lifter pin does not increase since there is almost no increase in clearance.

Also, the surface grooves 72x are formed in the upper half (more specifically, in the position above the region Xa where the amount of deposit is expected to be a maximum) of the lifter pin 72. This hardly increases the deposit resulting from film formation gases entering from below the worktable during film formation, and sticking to the upper portion of the lifer pin 72 or the lower surface of a substrate placed on the worktable 38. That is, the lower ends of the surface grooves 72x are positioned above the lower end of a guide hole 49. Therefore, film formation gases entering from the lower end of the guide hole 49 are not guided to the upper portion of the axial hole through the surface grooves 72x.

In the sixth embodiment, the upper ends of the surface grooves 72x are arranged at a level separated downward to some extent from the upper end of the lifter pin 72. Accordingly, gases entering from the lower end of the guide hole 49 during film formation do not easily reach the upper end of the lifter pin 72. This makes it possible to reduce the amount of deposit sticking to the lower surface of a substrate (wafer).

As shown in FIG. 9D, when an opening width 72xw of the surface groove 72x increases, the peripheral surface of the lifter pin 72 does not exist within the angular range of the opening width 72xw any longer. As a consequence, the radius of the lifter pin 72 slightly decreases by AD. The radius decrease AD abruptly increases as the opening width 72xw increases. That is, when the opening width 72xw increases to a certain degree, the clearance increases in the formation direction of the surface grooves 72x, and the tilt angle of the lifter pint 72 increases. This leads to an increase in sliding resistance of the lifter pin 72 or an increase in probability of the occurrence of a defective operation.

Accordingly, the opening width 72xw is desirably limited within a certain range so as not to cause any defective operation of the lifter pin 72. For example, letting CR be the clearance when the surface grooves 72x are not formed, the actual opening width 72xw is preferably smaller than the value of the opening width by which ΔD is 10%, more preferably, 5% of the clearance CR. Even when the opening width 72xw is thus limited to some extent, it is possible to assure a space having a sectional area sufficient to well diffuse the cleaning gas around the lifter pin, by increasing the number of the surface grooves 72x, or by increasing a depth 72xd of the surface grooves 72x.

In the example shown in FIG. 9C, the sectional shape of the surface groove 72x is a rectangle close to a square. To accelerate the diffusion of the cleaning gas into the surface grooves, the sectional shape of the surface groove 72x is preferably as close to a square as possible. For example, the ratio of the opening width 72xw to the depth 72xd of the surface groove 72 is set within the range of favorably 0.5 to 2.0, and more favorably, 0.75 to 1.5.

Also, the degree to which the sectional area of the space between the lifter pin 72 and guide hole 49 is increased by the surface grooves 72x is determined in accordance with the conditions of the cleaning step. For example, letting CS be the sectional area of this space corresponding to the clearance CR when the surface grooves 72x are not formed, the increase in sectional area of the space by the formation of the surface grooves 72x is set at preferably 50% to 200%, and more preferably, about 75% to 150% of the sectional area CS.

If the increase in sectional area by the surface grooves 72x is smaller than the above range, no satisfactory cleaning effect can be obtained by the formation of the surface grooves 72x. On the other hand, if the increase exceeds the above range, the opening width 72xw of the surface groove 72x increases, and this increases the radius decrease ΔD of the lifter pin. In the latter case, it is necessary to increase the number of the surface grooves 72x or increase the depth 72xd of the surface grooves 72x, and this makes machining of the lifter pin 72 difficult.

When film formation is to be performed under conditions having high-coverage characteristics (e.g., the internal pressure of the process container is 93.3 to 1,333 Pa), deposit easily sticks to that portion of the lifter pin 72, which is positioned deep in the worktable or sleeve. In this case, the structure of the lifter pin 72 is effective in that the deposit on the whole can be uniformly removed even from the deep portion. When film formation is to be performed under conditions having low-coverage characteristics (e.g., the internal pressure of the process container is 20 to 80 Pa), a large amount of deposit often collectively sticks to a specific region inside the worktable or sleeve as described earlier. In this case, the structure of the lifter pin 72 is effective in that the large amount of deposit sticking to this region can be efficiently removed.

Seventh Embodiment

Figure 10C:
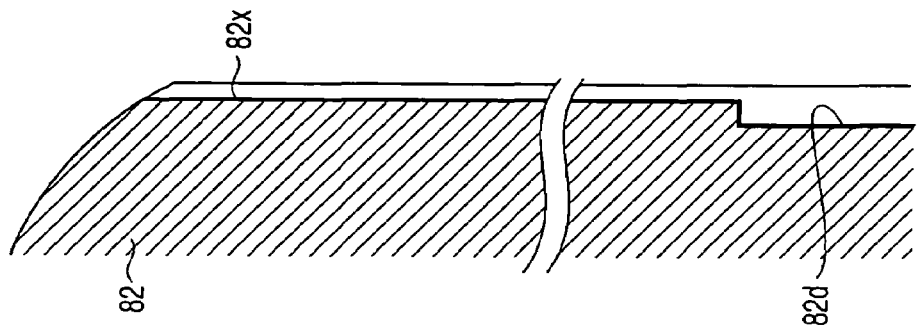
FIG. 10C is a view showing a portion of FIG. 10A in an enlarged scale.
Figure 10B:
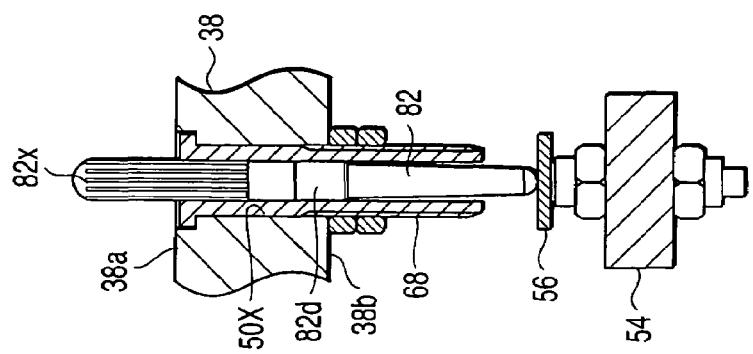
FIG. 10B is a sectional side view showing a state in which a lifter pin of the mechanism according to the seventh embodiment is raised.
Figure 10A:
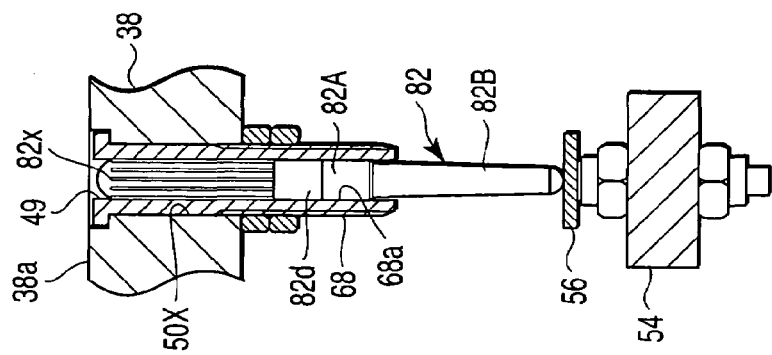
FIG. 10A is a sectional side view showing a portion of a substrate lifting mechanism according to a seventh embodiment applicable to the semiconductor processing apparatus shown in FIG. 1.

FIG. 10A is a sectional side view showing a portion of a substrate lifting mechanism according to a seventh embodiment applicable to the semiconductor processing apparatus shown in FIG. 1. FIG. 10B is a sectional side view showing a state in which a lifter pin of the mechanism according to the seventh embodiment is raised. FIG. 10C is a view showing a portion of FIG. 10A in an enlarged scale. In the seventh embodiment, a lifter pin 82 has an annular recess 82d formed in the same manner as in the fifth embodiment. Surface grooves 82x are formed above the annular recess 82d.

More specifically, the surface grooves 82x communicate with the annular recess 82d from above. As described above, the annular recess 82d is formed in that region (the same region as the region Xa in the sixth embodiment) of the peripheral surface of the lifter pin 82, in which the sticking amount of deposit is expected to be a maximum. That is, the annular recess 82d prevents a defective operation of the lifter pin 82 caused by the sticking of the deposit. Since the surface grooves 82x communicate with the annular recess 82d from above, the deposit sticking inside the annular recess 82d can be removed more efficiently (within a shorter time period) by a cleaning gas which diffuses through the surface grooves 82x.

Note that in the seventh embodiment, the number, shape, size, and the like of the surface grooves 82x can be designed in the same manner as for the surface grooves 72x in the sixth embodiment.

The lifter pin 82 has an upper shaft portion 82A and lower shaft portion 82B and the surface grooves 82x are formed in the peripheral surface of the upper shaft portion 82A in the seventh embodiment as well. The surface grooves 82x are so formed as to reach or open upward near the upper end of the lifter pin 82. This allows the upper portions of the surface grooves 82x to protrude from a worktable 38 by a slight lifting amount of the lifter pin 82. That is, the deposit on the lifter pin 82 can be effectively removed in a cleaning step.

Eighth Embodiment

Figure 11A:
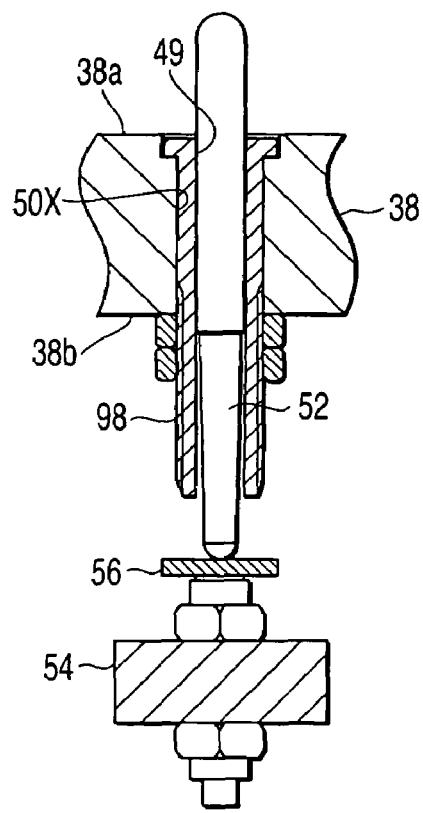
FIG. 11A is a sectional side view showing a portion of a substrate lifting mechanism according to an eighth embodiment applicable to the semiconductor processing apparatus shown in FIG. 1.
Figure 11B:
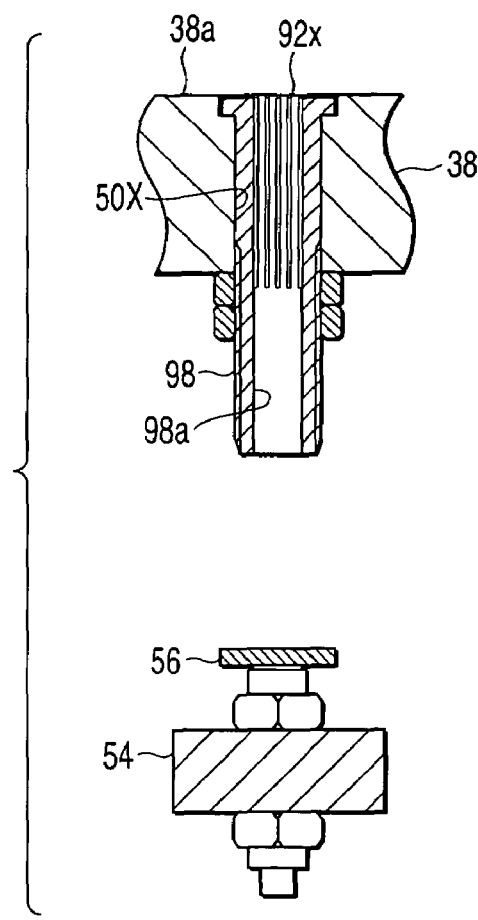
FIG. 11B is sectional side view showing the mechanism according to the seventh embodiment except for a lifter pin.

FIG. 11A is a sectional side view showing a portion of a substrate lifting mechanism according to an eighth embodiment applicable to the semiconductor processing apparatus shown in FIG. 1. FIG. 11B is a sectional side view showing the mechanism according to the seventh embodiment except for a lifter pin. As shown in FIG. 11B, the eighth embodiment differs from the sixth and seventh embodiments in that surface grooves 92x are formed in the inner surface of the upper portion of an axial hole 98a of an auxiliary pipe 98 in which a lifter pin can be inserted. The auxiliary pipe 98 is the same as the auxiliary pipe 68 of the third embodiment except that the surface grooves 92x are formed. Also, the mechanism of the eighth embodiment is the same as the third embodiment except for the auxiliary pipe 98.

The surface grooves 92x extend downward from the opening edge of the upper portion of the axial hole 98a. The lower ends of the surface grooves 92x terminate in the middle portion of the axial hole 98a without reaching the opening edge of the lower portion of the auxiliary pipe 98. That is, the surface grooves 92x are favorably formed from the upper end to the middle portion of the axial hole 98a. In addition, like the surface grooves described in the sixth and seventh embodiments, a plurality of surface grooves 92x are preferably formed. It is particularly desirable to form a plurality of surface grooves 92x at equal angular intervals around the axis. The opening width, depth, sectional shape, and the like of the surface grooves 92x can also be designed in the same manner as for the surface grooves 72x described in the sixth embodiment.

Since the surface grooves 92x are formed, it is possible to diffuse a cleaning gas to the depths of the axial hole 98a and raise the partial pressure of the gas in a cleaning step. This makes it possible to efficiently remove deposit sticking to a lifter pin 52 shown in FIG. 11A. In particular, regardless of the vertical position of the lifter pin 52, the cleaning gas can be diffused around the lifter pin such that the partial pressure rises. This allows efficient removal of the deposit.

Note that the surface grooves 92x need not be formed on the auxiliary pipe 98, and can also be directly formed in a through hole of a worktable if this arrangement is applied to the second embodiment. Note also that the surface grooves may also be formed in an arbitrary guide hole into which a lifter pin is inserted in another arbitrary worktable.

In the eighth embodiment, an annular recess similar to that of the seventh embodiment may also be formed on the lifter pin. In this case, the positional relationship and communicating structure of this annular recess and the surface grooves are preferably designed to be in the same manner as in the seventh embodiment in a state in which the lifter pin is set in the film formation position, i.e., the distal end of the lifter pin retracts in the axial hole. The annular recess may also be formed in the inner surface of the axial hole. The positional relationship and communicating structure of the annular recess and surface grooves are favorably designed in the same manner as in the seventh embodiment in this case as well.

Note that in the above embodiments, the semiconductor processing apparatus 20 is designed as a film formation apparatus which forms a thin TiN film on a target substrate such as a semiconductor wafer. However, the present invention has the effect of avoiding various inconveniences caused by diffusion of a process gas in various processing apparatuses. That is, the present invention can be applied to film formation apparatuses which form various thin films other than TiN, or various semiconductor processing apparatuses other than a film formation apparatus. For example, the present invention is also effective in an etching apparatus and surface modification apparatus in preventing, e.g., corrosion of the sliding surfaces between the lifter pin and guide hole, and erosion of that portion of a target substrate, which faces the upper opening of the guide hole. Also, a target substrate may also be, e.g., a substrate for an LCD or FPD, instead of a semiconductor wafer.

INDUSTRIAL APPLICABILITY

The present invention can alleviate inconveniences such as sticking of deposit caused by diffusion of a gas to a portion between a lifter pin and guide hole in an apparatus which performs a semiconductor process on a target substrate.

The invention claimed is:

1. An apparatus for performing a semiconductor process on a target substrate, comprising:
   a process container configured to accommodate the target substrate;
   a gas supply system configured to supply a process gas into the process container;

a worktable disposed in the process container, the worktable having an upper surface on which the target substrate is placed, and a lower surface which is exposed inside the process container; and a lifting mechanism configured to assist transfer of the target substrate with respect to the upper surface of the worktable, wherein the lifting mechanism comprises a lifter pin configured to support the target substrate, a driving unit configured to move the lifter pin up and down, and a guide hole configured to guide the lifter pin being moved up and down, the guide hole comprising a main hole portion which extends from the upper surface to the lower surface through the worktable, and an extended hole portion which extends into an extension sleeve which projects downward from the lower surface of the worktable to correspond to the main hole portion, wherein a groove portion is formed in an outer surface of the lifter pin and extends in a longitudinal direction of the lifter pin such that, when the lifter pin is set by the driving unit in a predetermined state where the lifter pin protrudes above the upper surface of the worktable, an upper side of the groove portion is exposed above the upper surface of the worktable while a lower side of the groove portion is present below the upper surface of the worktable.

2. The apparatus according to claim 1, wherein a length of the extended hole portion of the guide hole is larger than a half length of the main hole portion of the guide hole.

3. The apparatus according to claim 1, wherein an upper end of an auxiliary pipe is attached to the lower surface of the worktable, and the auxiliary pipe as a whole forms the extension sleeve, such that the extended hole portion is formed in the auxiliary pipe.

4. The apparatus according to claim 1, wherein an auxiliary pipe is inserted into a through hole which vertically extends through the worktable, and a portion of the auxiliary pipe, which projects downward from the lower surface of the worktable, forms the extension sleeve, such that the main hole portion and the extended hole portion are formed in the auxiliary pipe.

5. The apparatus according to claim 4, further comprising a flange formed at an upper end portion of the auxiliary pipe to engage with the worktable, and a fixing member configured to abut against the lower surface of the worktable to engage with an outer surface of the auxiliary pipe, wherein the auxiliary pipe is fixed to the worktable by cooperation of the flange and the fixing member.

6. The apparatus according to claim 1, wherein the driving unit moves the lifter pin up and down between first and second states, and the lifter pin protrudes above the upper surface of the worktable in order to assist transfer of the target substrate in the first state, and retracts below the upper surface of the worktable in order to perform the semiconductor process in the second state, and in the second state, a lower contact point at which the lifter pin comes in contact with an inner surface of the guide hole is positioned above a lower end portion of the extension sleeve.

7. The apparatus according to claim 6, wherein the lifter pin has an upper shaft portion and a lower shaft portion having a diameter smaller than that of the upper shaft portion, and a lower end portion of the upper shaft portion forms the lower contact point.

8. The apparatus according to claim 7, wherein the groove portion is formed on the upper shaft portion.

9. The apparatus according to claim 7, wherein the lower shaft portion has a tapered shape which gradually decreases a diameter thereof downward.

10. The apparatus according to claim 1, wherein an inner surface of the extended hole portion of the guide hole gradually increases a diameter thereof downward.

11. The apparatus according to claim 1, wherein the driving unit moves the lifter pin up and down between first and second states, and the lifter pin protrudes above the upper surface of the worktable in order to assist transfer of the target substrate in the first state, and retracts below the upper surface of the worktable in order to perform the semiconductor process in the second state, and an annular recess is formed in an outer surface of the lifter pin, and positioned above a lower end portion of the extension sleeve in the second state of the lifter pin.

12. The apparatus according to claim 1, wherein the driving unit moves the lifter pin up and down between first and second states, and the lifter pin protrudes above the upper surface of the worktable in order to assist transfer of the target substrate in the first state, and retracts below the upper surface of the worktable in order to perform the semiconductor process in the second state, and a lower end portion of the groove portion is positioned above a lower end portion of the extension sleeve in the second state of the lifter pin.

13. The apparatus according to claim 1, wherein a lower end portion of the lifter pin abuts against a driving surface of the driving unit so as to be separable therefrom.

14. The apparatus according to claim 1, wherein a plurality of groove portions are formed in the outer surface of the lifter pin, wherein the plurality of groove portions are provided at annular intervals about the outer surface.

15. The apparatus according to claim 1, wherein an annular recess is formed in the outer surface of the lifter pin at a position corresponding to a lower end portion of the groove portion, and wherein the annular recess communicates with the lower end portion of the groove portion.

16. The apparatus according to claim 1, wherein the groove portion has a ratio of an opening width relative to a depth, which is set within a range of 0.5 to 2.0.

17. A method for using the apparatus according to claim 1, wherein the method comprises supplying a cleaning gas into the process container while setting the lifter pin in the predetermined state, thereby diffusing the cleaning gas into the guide hole through the upper side of the groove portion.

18. An apparatus for performing a semiconductor process on a target substrate, comprising:

a process container configured to accommodate the target substrate;

a gas supply system configured to supply a process gas into the process container;

a worktable disposed in the process container, the worktable having an upper surface on which the target substrate is placed, and a lower surface which is exposed inside the process container; and a lifting mechanism configured to assist transfer of the target substrate with respect to the upper surface of the worktable, wherein the lifting mechanism comprises a lifter pin configured to support the target substrate, a driving unit configured to move the lifter pin up and down, and a guide hole configured to guide the lifter pin being moved up and down, the guide hole comprising a main hole portion which extends from the upper surface to the lower surface through the worktable, and an extended hole portion which extends into an extension sleeve which projects downward from the lower surface of the worktable to correspond to the main hole portion, wherein an auxiliary pipe is inserted into a through hole which vertically extends through the worktable such that the main hole portion and the extended hole portion are formed in the auxiliary pipe, and a groove portion is formed in an inner surface of the auxiliary pipe and extends in a longitudinal direction of the auxiliary pipe such that the groove portion has an upper end portion opened at an upper end portion of the auxiliary pipe.

19. The apparatus according to claim 18, wherein the groove portion has a lower end portion positioned above a lower end portion of the auxiliary pipe.

20. The apparatus according to claim 18, wherein a plurality of groove portions are formed in the inner surface of the auxiliary pipe, and wherein the plurality of groove portions are provided at annular intervals about the inner surface.

* * * * *